United States Patent
Liao et al.

(10) Patent No.: US 9,553,191 B1
(45) Date of Patent: Jan. 24, 2017

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Chin-I Liao, Tainan (TW); Mon-Nan How, Hsinchu (TW); Shih-Chieh Chang, Taipei (TW); Ying-Min Chou, Tainan (TW); Ting-Chang Chang, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/942,980

(22) Filed: Nov. 16, 2015

(51) Int. Cl.
| | |
|---|---|
| *H01L 29/78* | (2006.01) |
| *H01L 29/66* | (2006.01) |
| *H01L 21/306* | (2006.01) |
| *H01L 21/762* | (2006.01) |
| *H01L 21/283* | (2006.01) |
| *H01L 21/02* | (2006.01) |
| *H01L 29/06* | (2006.01) |
| *H01L 27/12* | (2006.01) |
| *H01L 21/84* | (2006.01) |

(52) U.S. Cl.
CPC ..... *H01L 29/7848* (2013.01); *H01L 21/02529* (2013.01); *H01L 21/02532* (2013.01); *H01L 21/02576* (2013.01); *H01L 21/02579* (2013.01); *H01L 21/02636* (2013.01); *H01L 21/283* (2013.01); *H01L 21/30604* (2013.01); *H01L 21/76224* (2013.01); *H01L 21/845* (2013.01); *H01L 27/1211* (2013.01); *H01L 29/0649* (2013.01); *H01L 29/66795* (2013.01); *H01L 29/785* (2013.01)

(58) Field of Classification Search
CPC .......... H01L 29/66545; H01L 21/823821; H01L 27/0924
See application file for complete search history.

(56) References Cited

U.S. PATENT DOCUMENTS

| | | | | |
|---|---|---|---|---|
| 2012/0091538 A1* | 4/2012 | Lin | ........... | H01L 29/66795 257/401 |
| 2013/0277752 A1* | 10/2013 | Glass | ........... | H01L 21/823821 257/369 |

* cited by examiner

*Primary Examiner* — Matthew Reames
(74) *Attorney, Agent, or Firm* — Jianq Chyun IP Office (57) ABSTRACT

A method of fabricating a FinFET includes at last the following steps. A semiconductor substrate is patterned to form a plurality of trenches in the semiconductor substrate and at least one semiconductor fin between the trenches. Insulators are formed in the trenches. A gate stack is formed over portions of the semiconductor fin and over portions of the insulators. A strained material doped with a conductive dopant is formed over portions of the semiconductor fin revealed by the gate stack, and the strained material is formed by selectively growing a bulk layer with a gradient doping concentration.

18 Claims, 12 Drawing Sheets

FIN FIELD EFFECT TRANSISTOR AND METHOD FOR FABRICATING THE SAME

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the semiconductor substrate, and the gate wrapping around the conducting channel that is formed by the fin further provides a better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing process of FinFETs and the FinFETs fabricated there-from. The FinFET may be formed on bulk silicon substrates in certain embodiments of the present disclosure. Still, the FinFET may be forming on a silicon-on-insulator (SOI) substrate or a germanium-on-insulator (GOI) semiconductor substrate as alternatives. Also, in accordance with the embodiments, the silicon substrate may include other conductive layers or other semiconductor element s, such as transistors, diodes or the like. The embodiments are not limited in this context.

Figure 1:
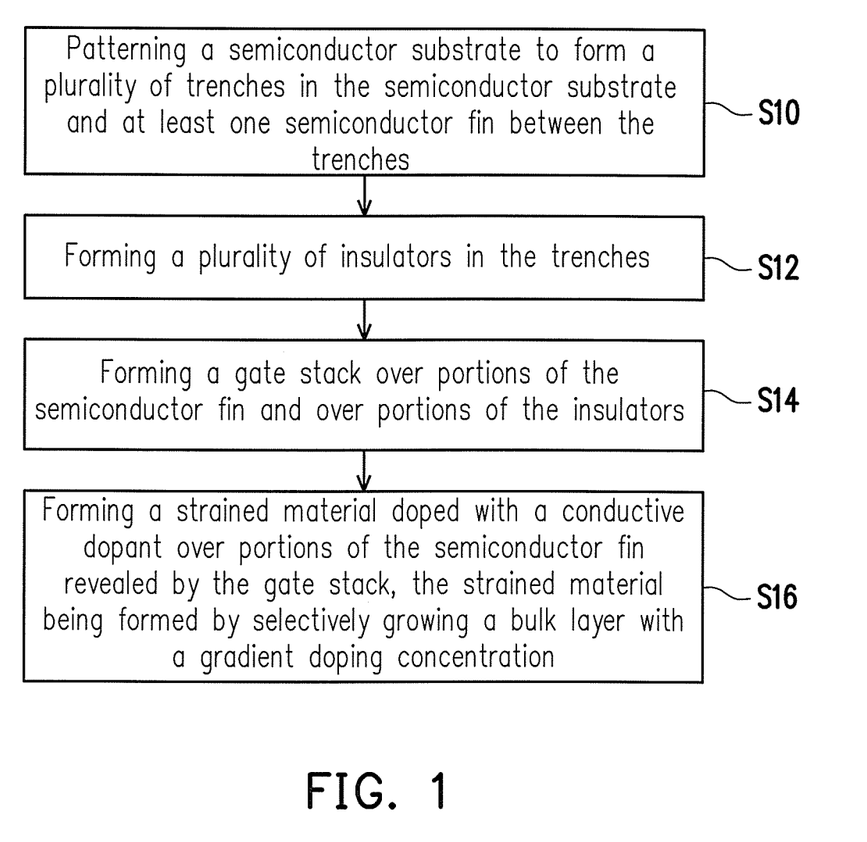
FIG. 1 is a flow chart illustrating a method for fabricating a FinFET in accordance with some embodiments.

Referring to FIG. 1, illustrated is a flow chart illustrating a method for fabricating a FinFET in accordance with some embodiments of the present disclosure. The method at least includes steps S10, step S12, step S14 and step S16. First, in step S10, a semiconductor substrate is patterned to form a plurality of trenches in the semiconductor substrate and at least one semiconductor fin between the trenches. Then, in step S12, insulators are formed on the semiconductor substrate and located in the trenches. The insulators are shallow trench isolation (STI) structures for insulating or isolating the semiconductor fins, for example. Thereafter, in step S14, a gate stack is formed over portions of the semiconductor fin and over the insulators; in step S16, a strained material doped with a conductive dopant is formed to cover the semiconductor fin revealed by the gate stack. The strained material includes a bulk layer, and the bulk layer of the strained material is selectively grown with a gradient doping concentration. As illustrated in FIG. 1, the strained material is formed after formation of the gate stack. However, formation sequence of the gate stack (step S14) and the strained material (step S16) is not limited in the present disclosure.

Figure 2A:
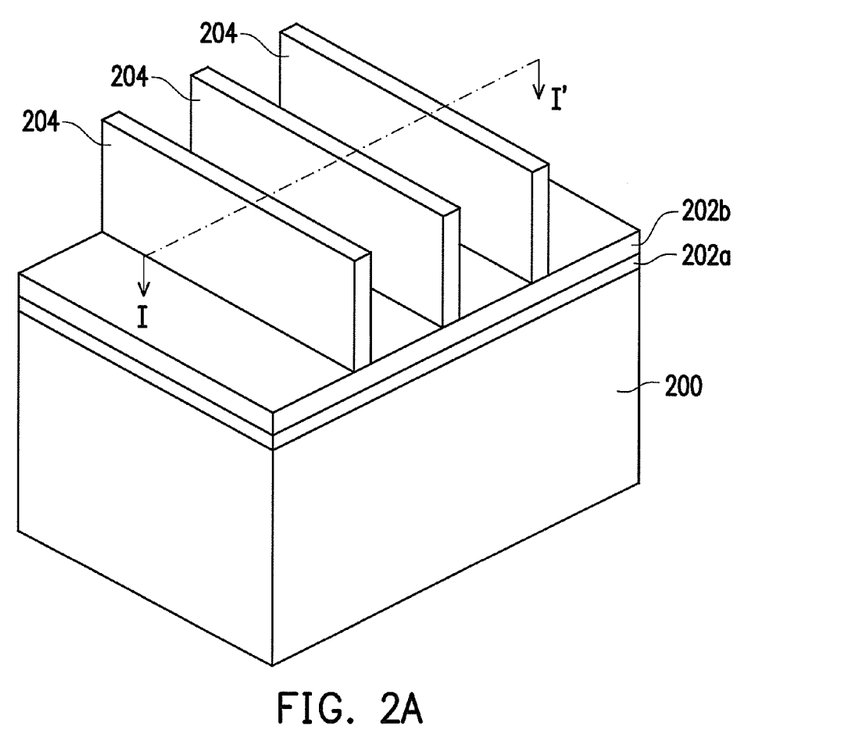
FIGS. 2A-2H are perspective views of a method for fabricating a FinFET in accordance with some embodiments.
Figure 3A:
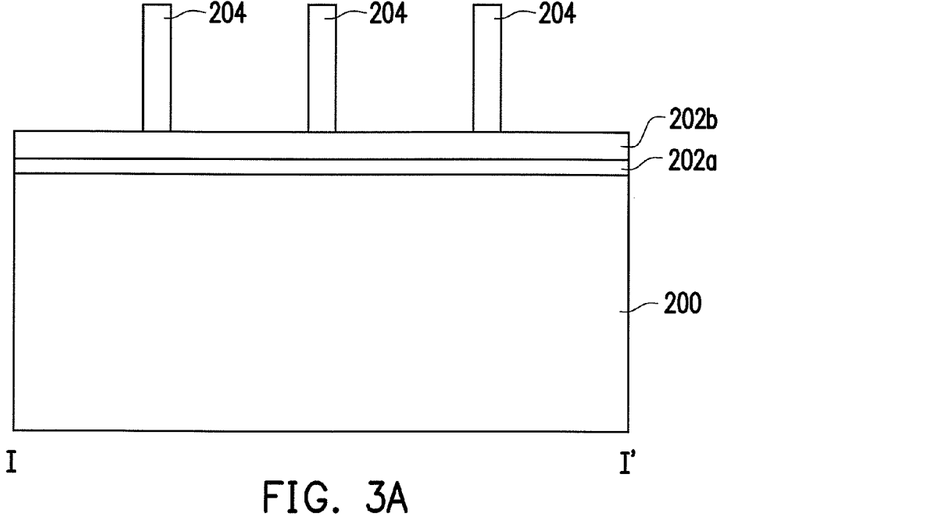
FIGS. 3A-3H are cross-sectional views of a method for fabricating a FinFET in accordance with some embodiments.

FIG. 2A is a perspective view of the FinFET at one of various stages of the manufacturing method, and FIG. 3A is a cross-sectional view of the FinFET taken along the line I-I' of FIG. 2A. In Step 10 in FIG. 1 and as shown in FIG. 2A and FIG. 3A, a semiconductor substrate 200 is provided. In one embodiment, the semiconductor substrate 200 comprises a crystalline silicon substrate (e.g., wafer). The semiconductor substrate 200 may comprise various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the semiconductor substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 202a and a mask layer 202b are sequentially formed on the semiconductor substrate 200. The pad layer 202a may be a silicon oxide thin film formed, for example, by thermal oxidation process. The pad layer 202a may act as an adhesion layer between the semiconductor substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. A patterned photoresist layer 204 having a predetermined pattern is formed on the mask layer 202b.

Figure 2B:
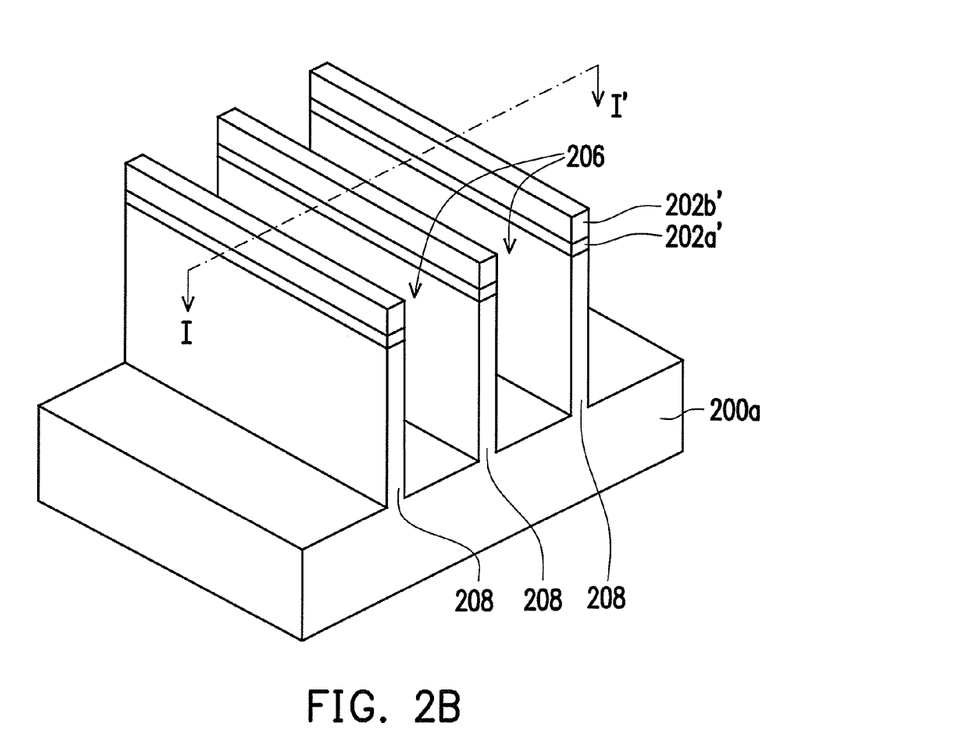
Figure 3B:
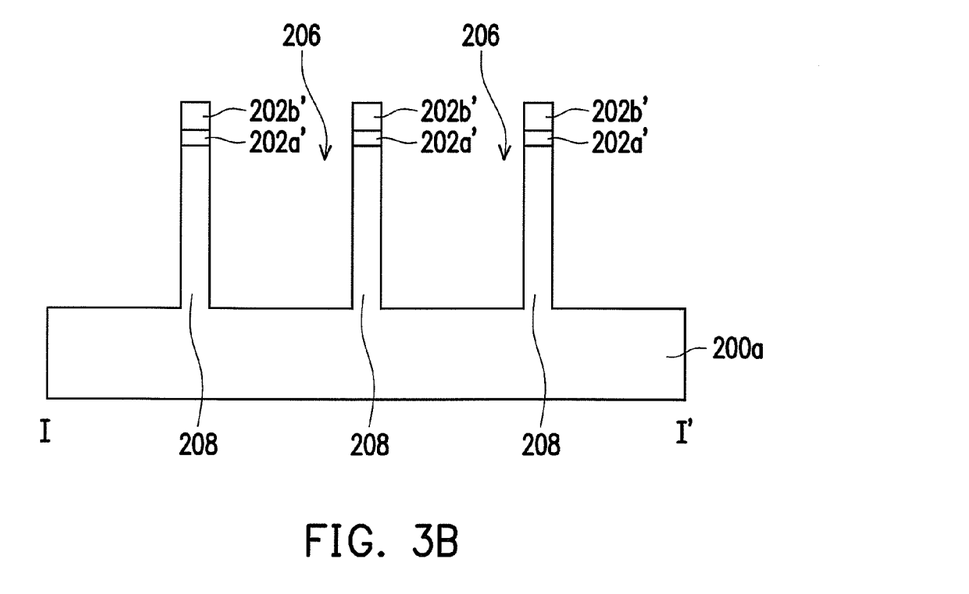

FIG. 2B is a perspective view of the FinFET at one of various stages of the manufacturing method, and FIG. 3B is a cross-sectional view of the FinFET taken along the line I-I' of FIG. 2B. In Step S10 in FIG. 1 and as shown in FIGS. 2A-2B and FIGS. 3A-3B, the mask layer 202b and the pad layer 202a which are not covered by the patterned photoresist layer 204 are sequentially etched to form a patterned mask layer 202b' and a patterned pad layer 202a' so as to expose underlying semiconductor substrate 200. By using the patterned mask layer 202b', the patterned pad layer 202a' and the patterned photoresist layer 204 as a mask, portions of the semiconductor substrate 200 are exposed and etched to form trenches 206 and semiconductor fins 208. The semiconductor fins 208 are covered by the patterned mask layer 202b', the patterned pad layer 202a' and the patterned photoresist layer 204. Two adjacent trenches 206 are spaced apart by a spacing. For example, the spacing between trenches 206 may be smaller than about 30 nm. In other words, two adjacent trenches 206 are spaced apart by a corresponding semiconductor fin 208.

The height of the semiconductor fins 208 and the depth of the trench 206 range from about 5 nm to about 500 nm. After the trenches 206 and the semiconductor fins 208 are formed, the patterned photoresist layer 204 is then removed. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 2C:
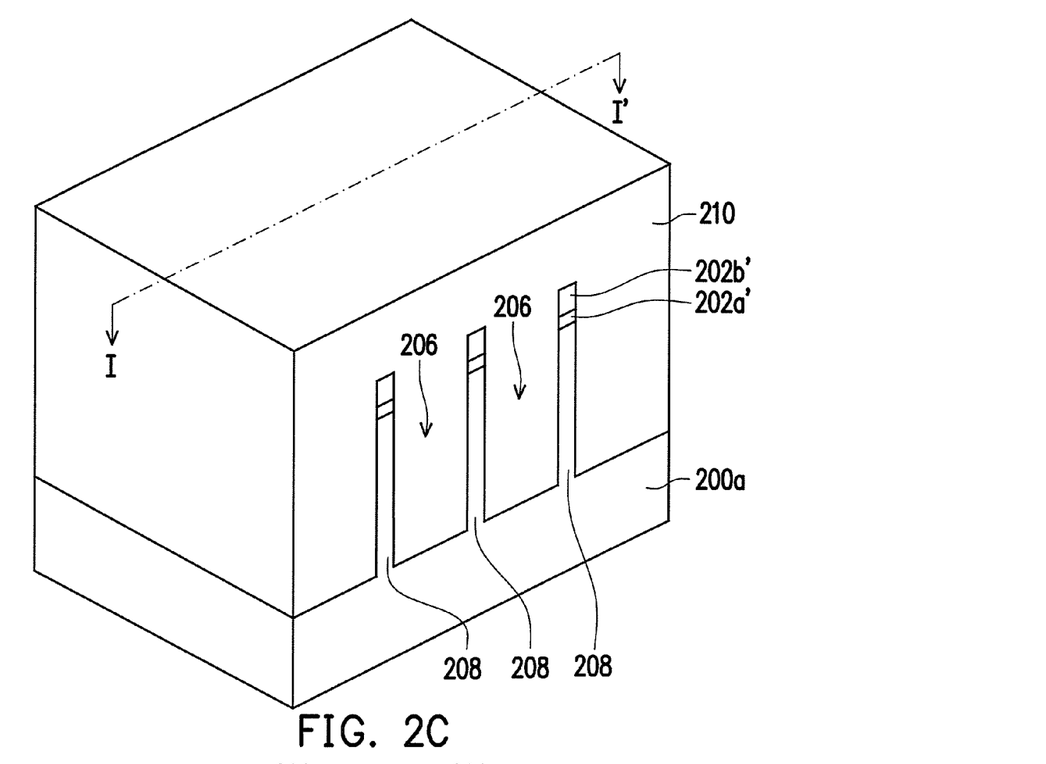
Figure 3C:
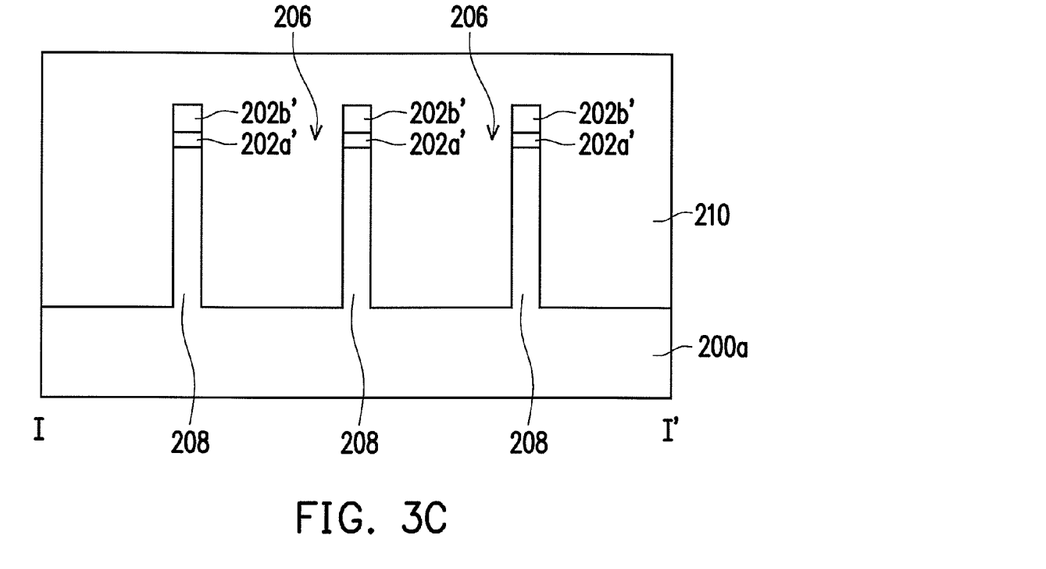

FIG. 2C is a perspective view of the FinFET at one of various stages of the manufacturing method, and FIG. 3C is a cross-sectional view of the FinFET taken along the line I-I' of FIG. 2C. In Step S12 in FIG. 1 and as shown in FIGS. 2B-2C and FIG. 3B-3C, an insulating material 210 is formed over the semiconductor substrate 200a to cover the semiconductor fins 208 and fill up the trenches 206. In addition to the semiconductor fins 208, the insulating material 210 further covers the patterned pad layer 202a' and the patterned mask layer 202b'. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 2D:
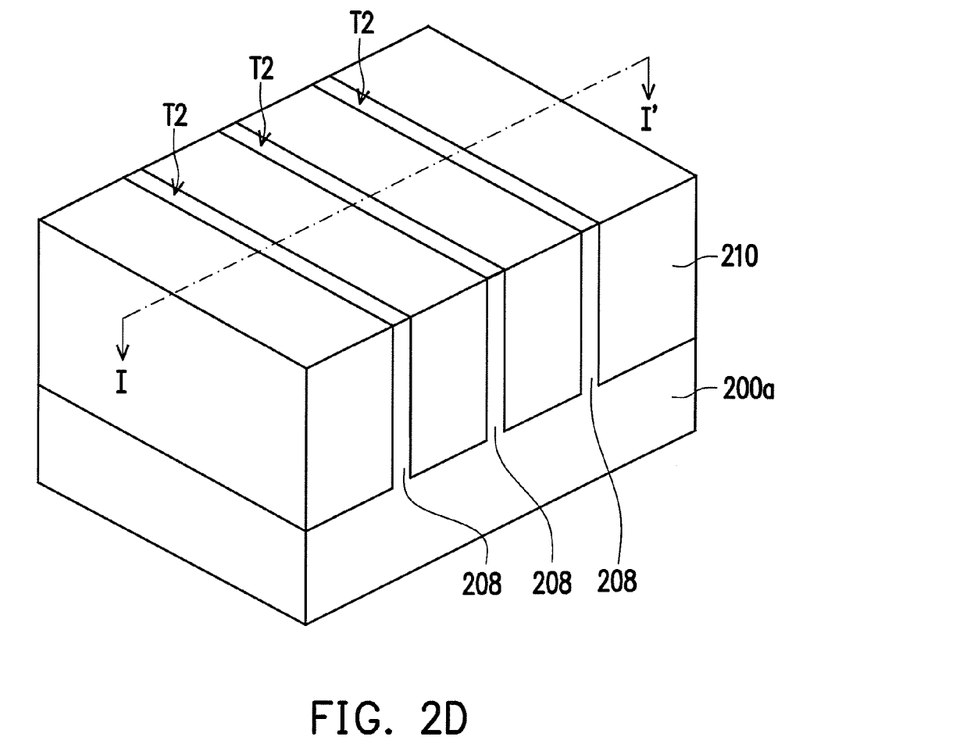
Figure 3D:
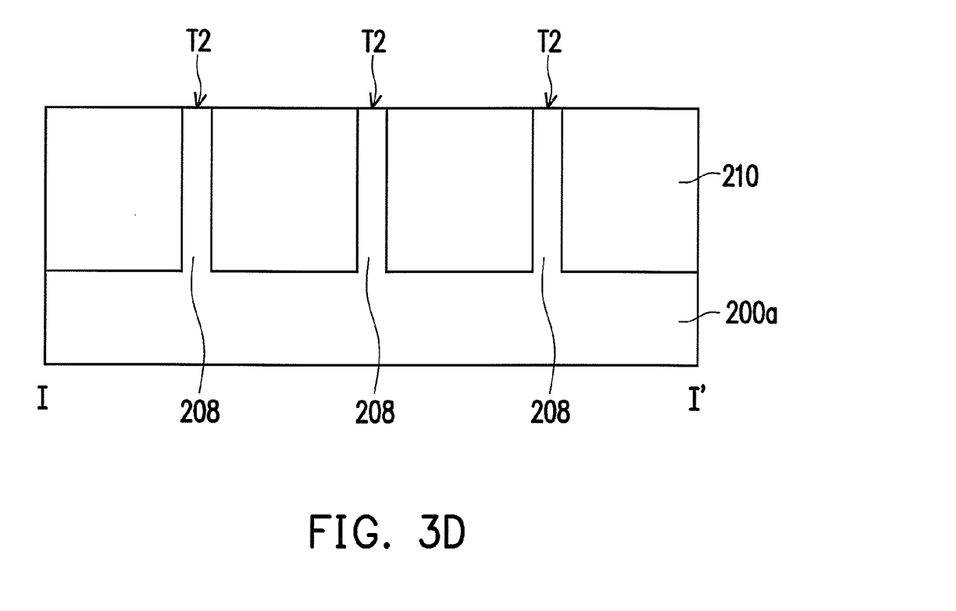

FIG. 2D is a perspective view of the FinFET at one of various stages of the manufacturing method, and FIG. 3D is a cross-sectional view of the FinFET taken along the line I-I' of FIG. 2D. In Step S12 in FIG. 1 and as shown in FIGS. 2C-2D and FIGS. 3C-3D, a chemical mechanical polish process is, for example, performed to remove a portion of the insulating material 210, the patterned mask layer 202b' and the patterned pad layer 202a' until the semiconductor fins 208 are exposed. As shown in FIG. 2D and FIG. 3D, after the insulating material 210 is polished, top surfaces of the polished insulating material 210 is substantially coplanar with top surface T2 of the semiconductor fins 208.

Figure 2E:
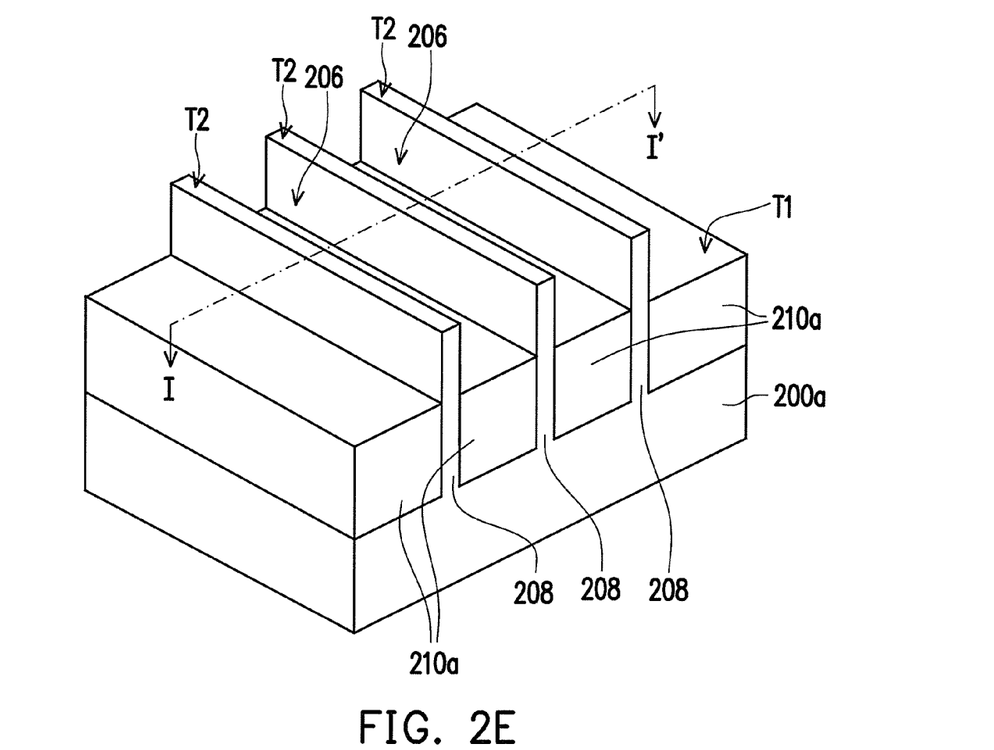
Figure 3E:
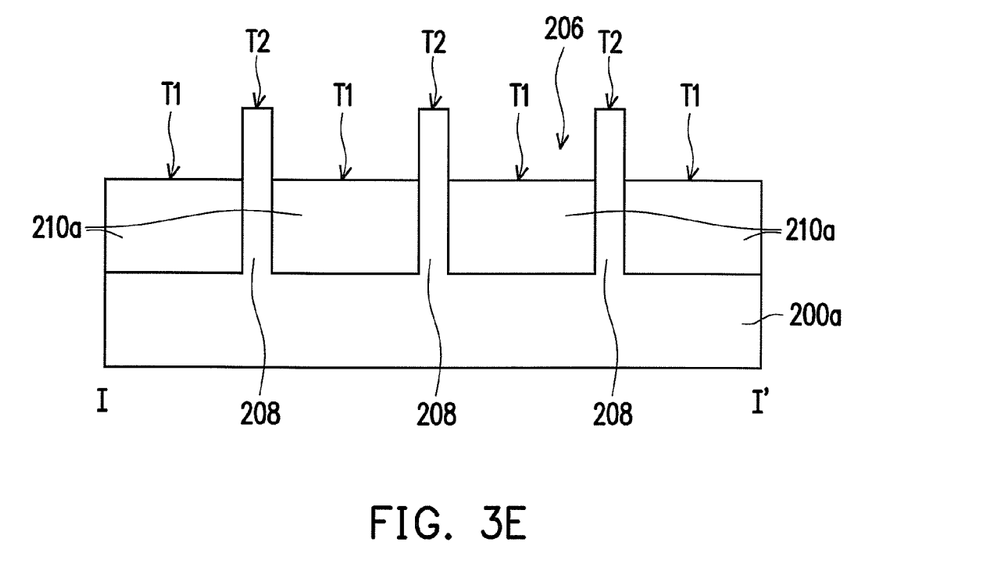

FIG. 2E is a perspective view of the FinFET at one of various stages of the manufacturing method, and FIG. 3E is a cross-sectional view of the FinFET taken along the line I-I' of FIG. 2E. In Step S12 in FIG. 1 and as shown in FIGS. 2D-2E and FIGS. 3D-3E, the polished insulating material 210 filled in the trenches 206 is partially removed by an etching process such that insulators 210a are formed on the semiconductor substrate 200a and each insulator 210a is located between two adjacent semiconductor fins 208. In one embodiment, the etching process may be a wet etching process with hydrofluoric acid (HF) or a dry etching process. The top surfaces T1 of the insulators 210a are lower than the top surfaces T2 of the semiconductor fins 208. The semiconductor fins 208 protrude from the top surfaces T1 of the insulators 210a. The height difference between the top surfaces T2 of the semiconductor fins 208 and the top surfaces T1 of the insulators 210a ranges from about 15 nm to about 50 nm.

Figure 2F:
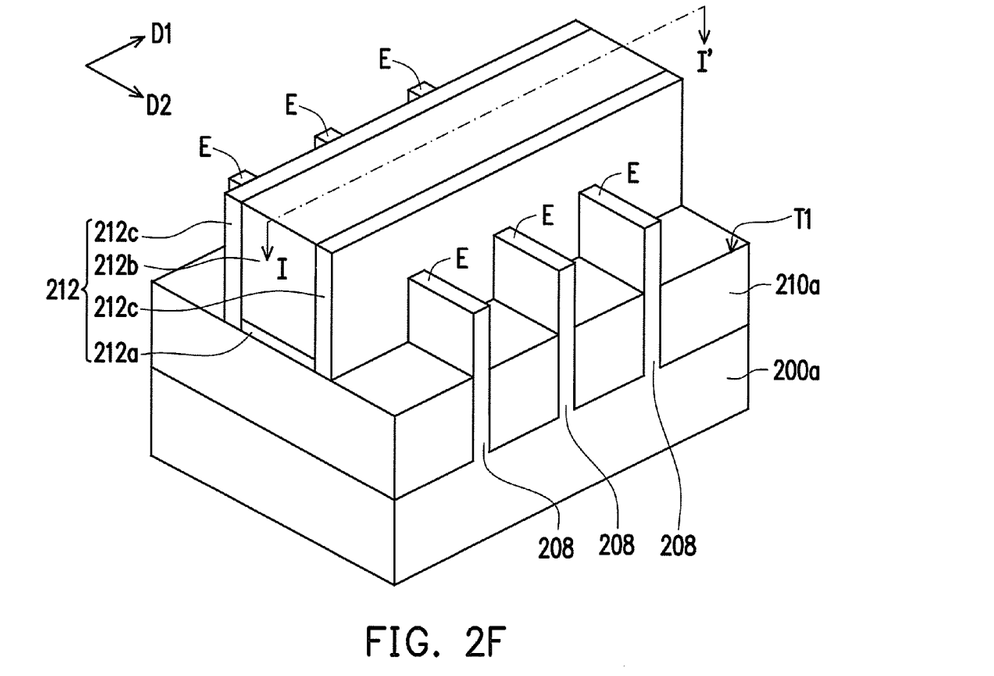
Figure 3F:
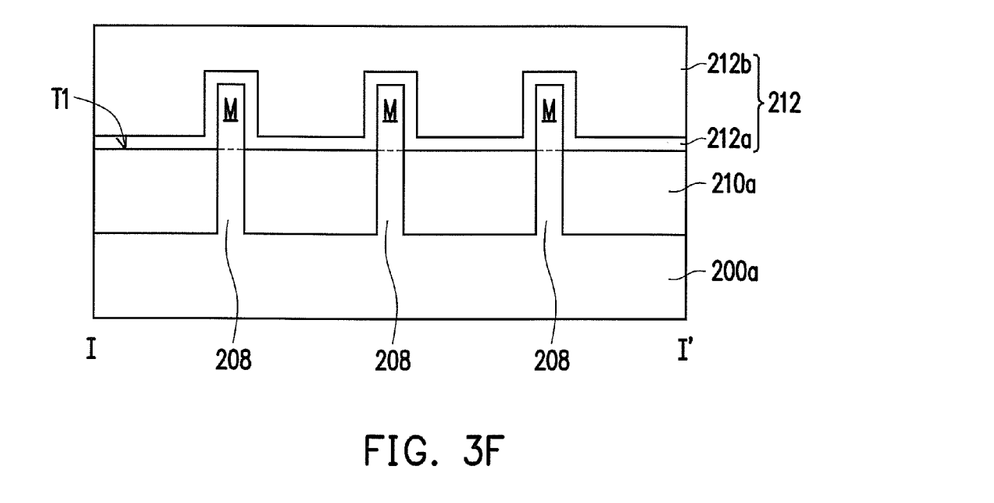

FIG. 2F is a perspective view of the FinFET at one of various stages of the manufacturing method, and FIG. 3F is a cross-sectional view of the FinFET taken along the line I-I' of FIG. 2F. In Step S14 in FIG. 1 and as shown in FIGS. 2E-2F and FIGS. 2F-3F, a gate stack 212 is formed over portions of the semiconductor fins 208 and portion of the insulators 210a. In one embodiment, the extending direction D1 of the gate stack 212 is, for example, perpendicular to the extension direction D2 of the semiconductor fins 208 so as to cover the middle portions M (shown in FIG. 3F) of the semiconductor fins 208. The aforesaid middle portions M may act as channels of the tri-gate FinFET. The gate stack 212 comprises a gate dielectric layer 212a and a gate electrode layer 212b disposed over the gate dielectric layer 212a. The gate dielectric layer 212b is disposed over portions of the semiconductor fins 208 and over portions of the insulators 210a.

The gate dielectric 212a is formed to cover the middle portions M of the semiconductor fins 208. In some embodiments, the gate dielectric layer 212a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 212a is a high-k dielectric layer with a thickness in the range of about 10 to 30 angstroms. The gate dielectric layer 212a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212a may further comprise an interfacial layer (not shown) to reduce damage between the gate dielectric layer 212a and semiconductor fins 208. The interfacial layer may comprise silicon oxide.

The gate electrode layer 212b is then formed on the gate dielectric layer 212a. In some embodiments, the gate electrode layer 212b may comprise a single layer or multi-layered structure. In some embodiments, the gate electrode layer 212b may comprise poly-silicon or metal, such as Al, Cu, W, Ti, Ta, TiN, TiAl, TiAlN, TaN, NiSi, CoSi, other conductive materials with a work function compatible with the semiconductor substrate material, or combinations thereof. In some embodiments, the gate electrode layer 212b includes a silicon-containing material, such as poly-silicon, amorphous silicon or a combination thereof, and is formed prior to the formation of the strained material 214. In some embodiments, the gate electrode layer 212b comprises a thickness in the range of about 30 nm to about 60 nm. The gate electrode layer 212b may be rimmed using a suitable process such as ALD, CVD, PVD, plating, or combinations thereof.

In addition, the gate stack 212 may further comprise a pair of spacers 212c disposed on sidewalls of the gate dielectric layer 212a and the gate electrode layer 212b. The pair of spacer 212c may further cover portions of the semiconductor fins 208. The spacers 212c are formed of dielectric materials, such as silicon nitride or SiCON. The spacers 212c may include a single layer or multilayer structure. Portions of the semiconductor fins 208 that are not covered by the gate stack 212 are referred to as exposed portions E hereinafter.

Figure 2G:
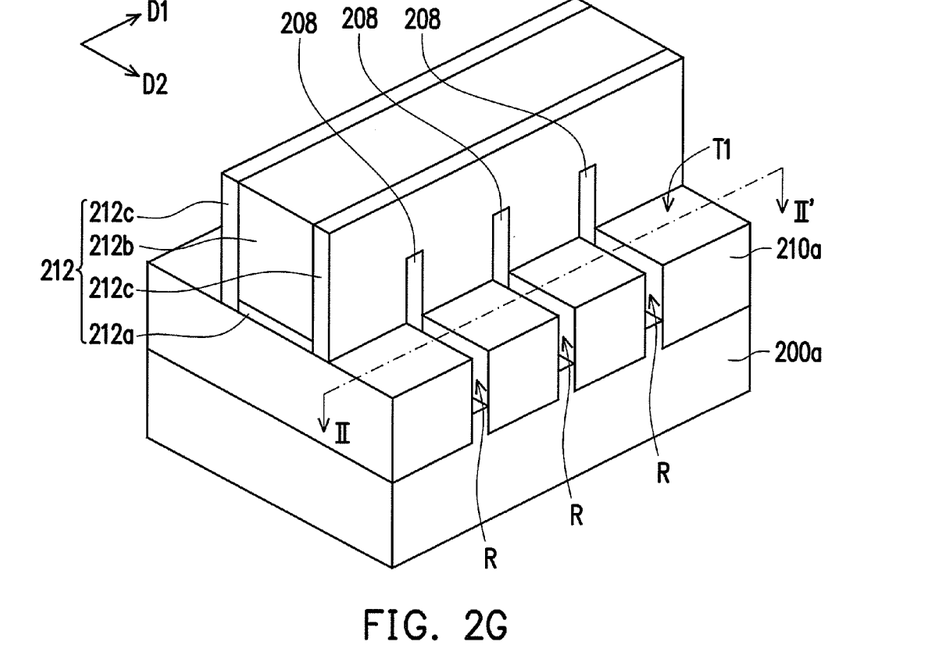
Figure 3G:
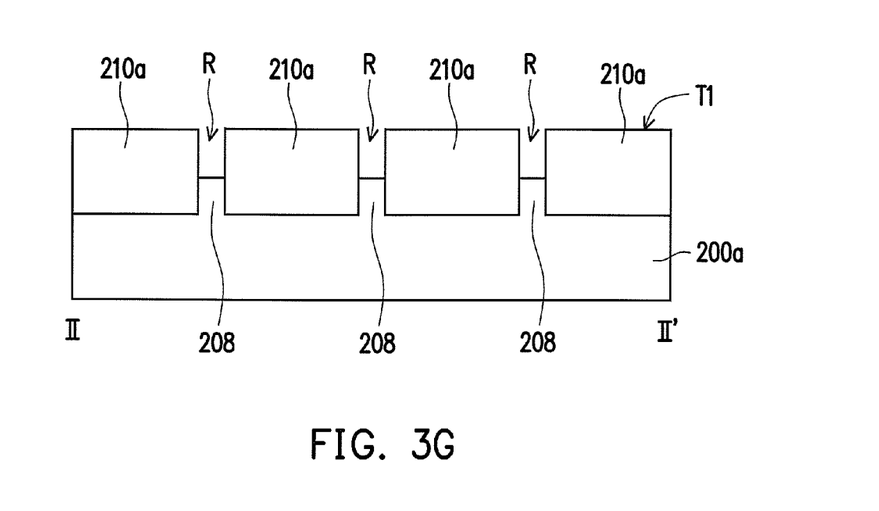

FIG. 2G is a perspective view of the FinFET at one of various stages of the manufacturing method, and FIG. 3G is a cross-sectional view of the FinFET taken along the line II-II' of FIG. 2G. In Step S16 in FIG. 1 and as shown in FIGS. 2F-2G and FIGS. 3F-3G, the exposed portions E of the semiconductor fins 208 are removed and recessed to formed recessed portions R. For example, the exposed portions E are removed by anisotropic etching, isotropic etching or the combination thereof. In some embodiments, the exposed portions E of the semiconductor fins 208 are recessed below the top surfaces T1 of the insulators 210a. The depth of the recessed portions R is less than the thickness of the insulators 210a. In other words, the exposed portions E of the semiconductor fins 208 are not entirely removed. As show in FIG. 2G and FIG. 3G, portions of the semiconductor fins 208 covered by the gate stack 212 is not removed when the exposed portions E of the semiconductor fins 208 are recessed. The portions of the semiconductor fins 208 covered by the gate stack 212 are exposed at sidewalls of the gate stack 212.

Figure 2H:
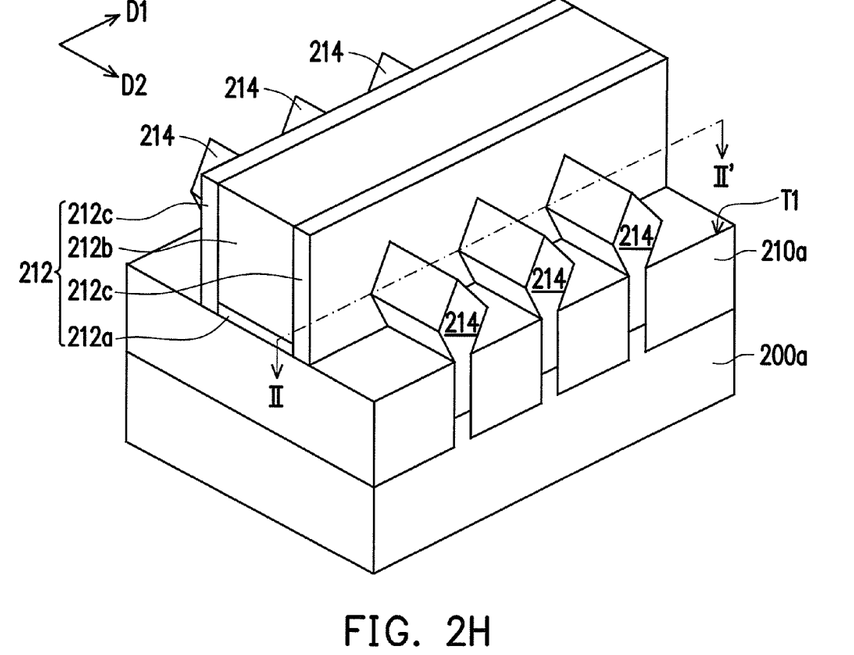
Figure 3H:
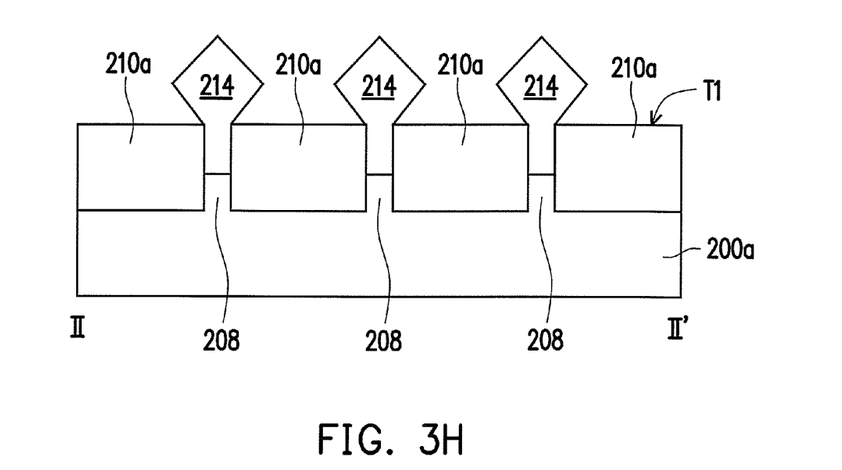

FIG. 2H is a perspective view of the FinFET at one of various stages of the manufacturing method, and FIG. 3H is a cross-sectional view of the FinFET taken along the line II-II' of FIG. 2H. In Step S16 in FIG. 1 and as shown in FIGS. 2G-2H and FIGS. 2G-3H, a strained material 214 is selectively grown over the recessed portions R of the semiconductor fin 208 and extends beyond the top surfaces T1 of the insulators 210a to strain or stress the semiconductor fins 208. The strained material 214 comprises a source disposed at a side of the stack gate 212 and a drain disposed at the other side of the gate stack 212. The source covers an end of the semiconductor fins 208 and the drain covers the other end of the semiconductor fins 208.

The strained material 214 is doped with a conductive dopant. In one embodiment, the strained material 214, such as SiGe, is epitaxial-grown with a p-type dopant for straining a p-type FinFET. That is, the strained material 214 is doped with the p-type dopant to be the source and the drain of the p-type FinFET. The p-type dopant comprises boron or $BF_2$, and the strained material 214 may be epitaxial-grown by LPCVD process with in-situ doping. In another embodiment, the strained material 214, such as SiC, is epitaxial-grown with an n-type dopant for straining an n-type FinFET. That is, the strained material 214 is doped with the n-type dopant to be the source and the drain of the n-type FinFET. The n-type dopant comprises arsenic and/or phosphorus, and the strained material 214 may be epitaxial-grown by LPCVD process with in-situ doping. The strained material 214 includes a bulk layer selectively grown with a gradient doping concentration. The method for forming the strained material including the bulk layer selectively grown with the gradient doping concentration is described as following paragraphs.

Figure 4:
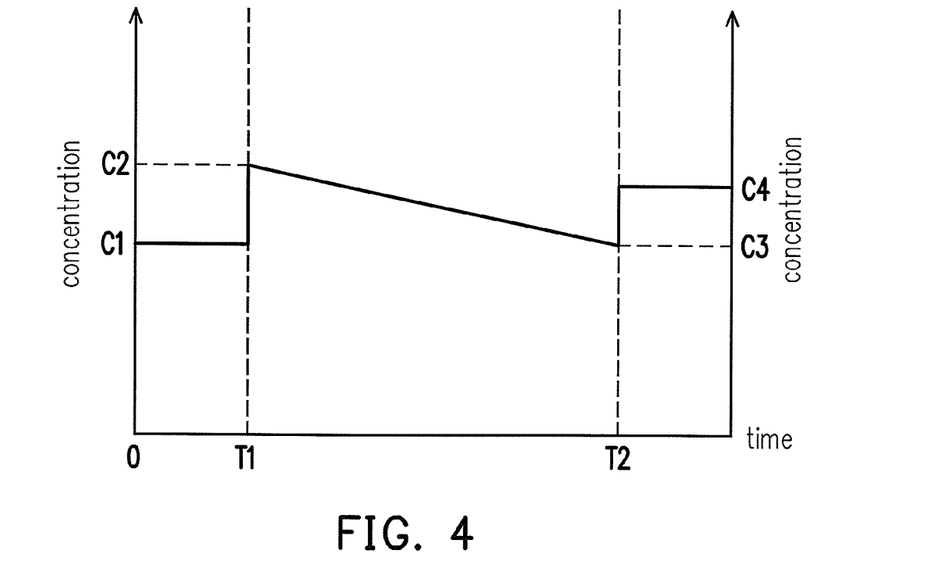
FIG. 4 is a diagram showing a method for forming a strained material of the FinFET in accordance with some embodiments.
Figure 5:
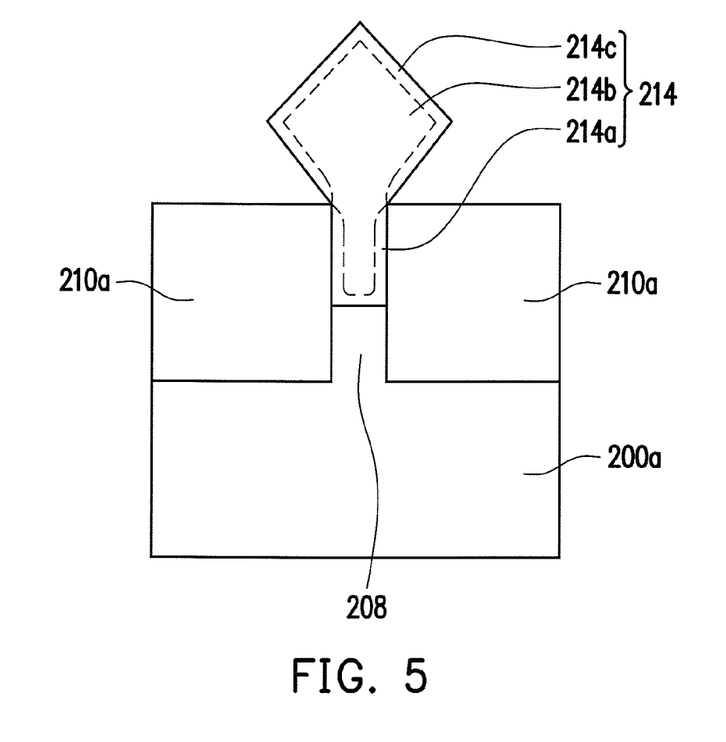
FIG. 5 is an enlarged drawing of FIG. 3H in accordance with some embodiments.

FIG. 4 is a diagram showing a method for forming a strained material of the FinFET, and FIG. 5 is an enlarged drawing of FIG. 3H. The diagram of FIG. 4 shows a relation between the epitaxial process time and the doping concentration. As shown in FIG. 4 and FIG. 5, the method for forming the strained material 214 includes the following steps. First, a first layer 214a is selectively grown with a first doping concentration C1 from a starting time to time T1. In one embodiment, the first doping concentration C1 ranges from 2E20 atoms/cm³ to 6E20 atoms/cm³, and a first growing time from the starting time to time T1 may be between 100 seconds and 600 seconds to as to form the first layer 214a. In some embodiments, the first layer 214a is grown from the recessed portion of the semiconductor fin 218 and does not fill up the recessed portion of the semiconductor fin 218, that is, the first layer 214a is selectively growing with the first doping concentration C1 on a surface of the recessed portion of the semiconductor fin 208. The first layer 214a may be a conformal layer in the recessed portion of the semiconductor fin 208 and does not fill up the recessed portion of the semiconductor fin 208 to be a protective layer.

After forming the first layer 214a, a bulk layer 214b is selectively grown on the first layer 214a with a gradient doping concentration. The bulk layer 214a fills the recessed portion of the semiconductor fin 218 and extending beyond the top surfaces of the insulators 210a. The bulk layer 214b is grown from time T1 to time T2. In some embodiments, the gradient doping concentration of the bulk layer 214b is from high to low as a time of selectively growing the bulk layer 214b passes. That is, the doping concentration C2 at time T1 is higher than the doping concentration C3 at time T2. The gradient doping concentration of the bulk layer 214b may be a linear gradient from the doping concentration C2 to the doping concentration C3. In one embodiment, the doping concentration C2 ranges from 7E20 atoms/cm³ to 5E21 atoms/cm³, the doping concentration C3 ranges from 2E20 atoms/cm³ to 2E21 atoms/cm³, and a second growing time from the time T2 to time T3 may be between 350 seconds and 1050 seconds, so as to form the bulk layer 214b with a gradient dopant concentration. In one embodiment, the gradient doping concentration for selectively growing the bulk layer 214b ranges from 1.0 E21 atoms/cm³ to 7.4E20 atoms/cm³.

After forming the bulk layer 214b, a second layer 214c is selectively grown on the bulk layer 214b with a second doping concentration from time T3 to an ending time. In one embodiment, the second doping concentration C4 ranges from 2E20 atoms/cm³ to 2E21 atoms/cm³, and a third growing time from time T2 to the ending time may be between 100 seconds and 600 seconds, so as to form the second layer 214b with a second dopant concentration. The second layer 214b caps a top surface of the bulk layer 214b so as to protect the bulk layer 214b.

In some embodiments, the first layer 214a, the bulk layer 214b and the second layer 214c form the strained material 214, and the gradient doping concentration of the bulk layer 214b is from high to low as a time of selectively growing the bulk layer 214b passes. Normally, the concentration distribution of the dopant in the strained material may affect the total resistance of the strained material. In this case, since the bulk layer 214b of the strained material 214 is grown with a gradient doping concentration, the total resistance of the strained material 214 may be reduced about 20% and the device performance may be improved about 10% comparing with the conventional finFET.

Figure 6:
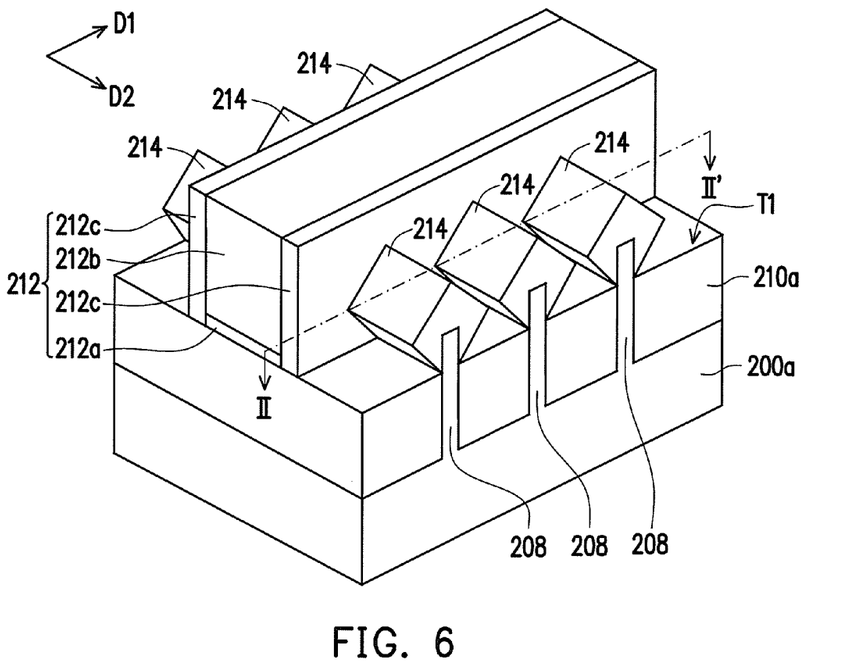
FIG. 6 is a perspective view of a FinFET in accordance with some embodiments.
Figure 7:
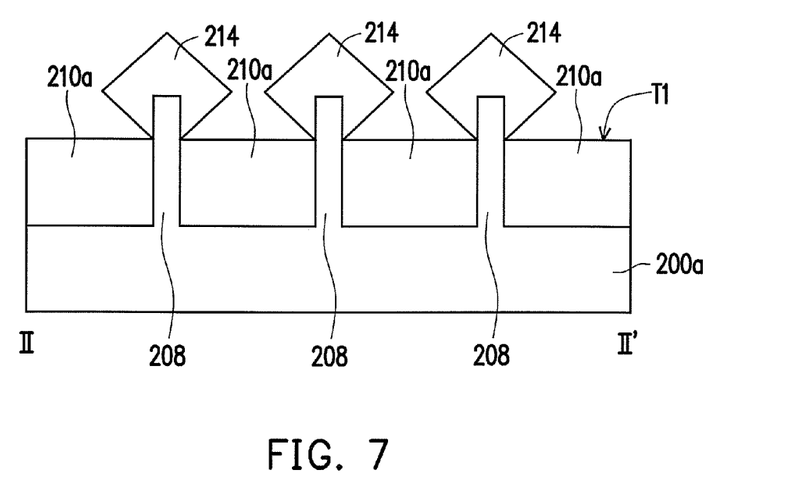
FIG. 7 is a cross-sectional view of a FinFET in accordance with some embodiments.
Figure 8:
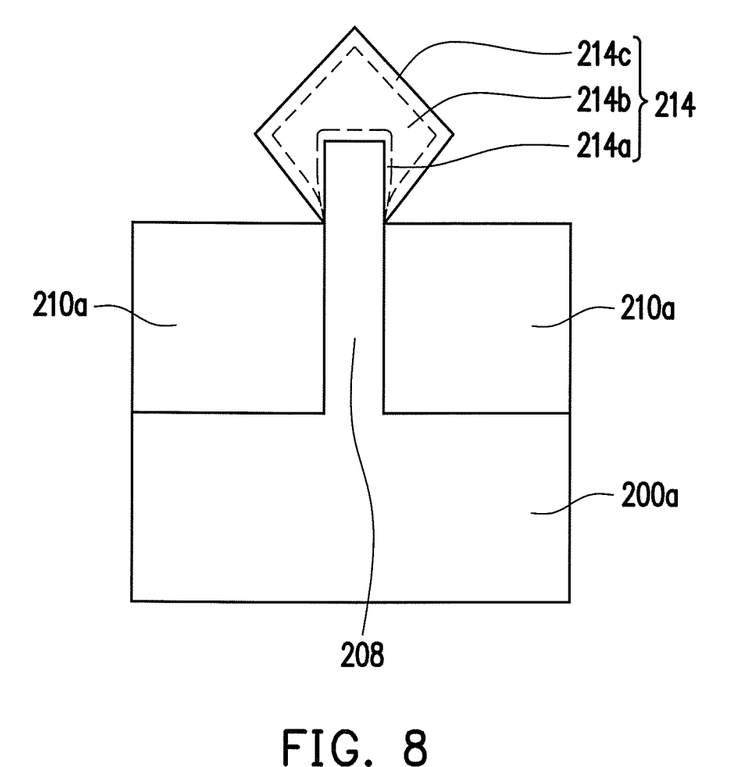
FIG. 8 is an enlarged drawing of FIG. 7 in accordance with some embodiments.

FIG. 6 is a perspective view of a FinFET, FIG. 7 is a cross-sectional view of the FinFET taken along the line II-II' of FIG. 6, and FIG. 8 is an enlarged drawing of FIG. 7. In the embodiment, the fabricating steps for the FinFET include performing the process steps the same with or similar to the steps showing in FIGS. 2A-2F and FIGS. 3A-3F. After forming the semiconductor fin 208, the isolators 210a and the gate stack 212, the strained material portions 214 are selectively grown over portions of the semiconductor fin 208 revealed by the gate stack 212, as shown in FIG. 6 and FIG. 7. The method for forming the strained material including the bulk layer selectively grown with the gradient doping concentration is as shown in FIG. 4 and FIG. 8.

Referring to FIG. 4, and FIG. 8, the method for forming the strained material 214 includes the following steps. First, a first layer 214a is selectively grown with a first doping concentration C1 from a starting time to time T1. In one embodiment, the first doping concentration C1 ranges from 2E20 atoms/cm$^3$ to 6E20 atoms/cm$^3$, and a first growing time from the starting time to time T1 may be between 100 seconds and 600 seconds to as to form the first layer 214a. In some embodiments, the semiconductor fin 208 does not have a recessed portion, and thus the first layer 214a is grown on a surface of the semiconductor fin 208 exposed by the isolators 210a. The first layer 214a may be a conformal layer on the exposed surface of the semiconductor fin 208 to be a protective layer.

After forming the first layer 214a, as shown in FIG. 4, and FIG. 8, a bulk layer 214b is selectively grown on the first layer 214a with a gradient doping concentration. The bulk layer 214b covers the first layers 214a and extends beyond the top surfaces of the insulators 210a. The bulk layer 214b is grown from time T1 to time T2. In some embodiments, the gradient doping concentration of the bulk layer 214b is from high to low as a time of selectively growing the bulk layer 214b passes. That is, the doping concentration C2 at time T1 is higher than the doping concentration C3 at time T2. The gradient doping concentration of the bulk layer 214b may be a linear gradient from the doping concentration C2 to the doping concentration C3. In one embodiment, the doping concentration C2 ranges from 7E20 atoms/cm$^3$ to 5E21 atoms/cm$^3$, the doping concentration C3 ranges from 2E20 atoms/cm$^3$ to 2E21 atoms/cm$^3$, and a second growing time from the time T2 to time T3 may be between 350 seconds and 1050 seconds, so as to form the bulk layer 214b with a gradient dopant concentration. In one embodiment, the gradient doping concentration for selectively growing the bulk layer 214b ranges from 1.0 E21 atoms/cm$^3$ to 7.4E20 atoms/cm$^3$.

After the bulk layer 214b is formed, as shown in FIG. 4, and FIG. 8, a second layer 214c is selectively grown on the bulk layer 214b with a second doping concentration from time T3 to an ending time. In one embodiment, the second doping concentration C4 ranges from 2E20 atoms/cm$^3$ to 2E21 atoms/cm$^3$, and a third growing time from time T2 to the ending time may be between 100 seconds and 600 seconds, so as to form the second layer 214b with a second dopant concentration. The second layer 214b caps a top surface of the bulk layer 214b so as to protect the bulk layer 214b.

In some embodiments, the semiconductor fin 208 does not have a recessed portion, the strained material 214 includes the first layer 214a, the bulk layer 214b and the second layer 214c, and the bulk layer 214b is selectively grown with a gradient doping concentration. Similarly, the concentration distribution of the dopant in the strained material may affect the total resistance of the strained material. In this case, since the bulk layer 214b of the strained material 214 is grown with a gradient doping concentration, the total resistance of he strained material 214 is reduced and the device performance is improved.

In accordance with some embodiments of the present disclosure, a method of fabricating a FinFET includes at last the following steps. A semiconductor substrate is patterned to form a plurality of trenches in the semiconductor substrate and at least one semiconductor fin between the trenches. Insulators are formed in the trenches. A gate stack is formed over portions of the semiconductor fin and over portions of the insulators. A strained material doped with a conductive dopant is formed over portions of the semiconductor fin revealed by the gate stack, and the strained material is formed by selectively growing a bulk layer with a gradient doping concentration.

In accordance with some embodiments of the present disclosure, a method of fabricating a FinFET includes at last the following steps. A semiconductor substrate is patterned to form a plurality of trenches in the semiconductor substrate and at least one semiconductor fin between the trenches. Insulators are formed in the trenches. A gate stack is formed over portions of the semiconductor fin and over portions of the insulators. The semiconductor fin revealed by the gate stack is removed to form a recessed portion of the semiconductor fin. A strained material doped with a conductive dopant is selectively grown, and the strained material is grown from the recessed portion of the semiconductor fin to cover the portions of the semiconductor fin revealed by the gate stack. The strained material includes a bulk layer, and the bulk layer of the strained material is selectively grown with a gradient doping concentration.

In accordance with some embodiments of the present disclosure, a FinFET includes a semiconductor substrate, isolators, a gate stack, and a doped strained material. The semiconductor substrate includes at least one semiconductor fin thereon. The insulators are disposed on the semiconductor substrate, and the semiconductor fin is sandwiched by the insulators. The gate stack is disposed over portions of the semiconductor fin and over portions of the insulators. The doped strained material covers portions of the semiconductor fin revealed by the gate stack, and the doped strained material includes a bulk layer having a gradient dopant concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a fin field effect transistor (FinFET), comprising:
   patterning a semiconductor substrate to form a plurality of trenches in the semiconductor substrate and at least one semiconductor fin between the trenches;
   forming a plurality of insulators in the trenches;

forming a gate stack over portions of the semiconductor fin and over portions of the insulators; and forming a strained material doped with a conductive dopant over portions of the semiconductor fin revealed by the gate stack, the strained material being formed by selectively growing an epitaxial layer with a gradient doping concentration of the conductive dopant, the gradient doping concentration being from a first concentration to a second concentration as a time of selectively growing the epitaxial layer passes, and the first concentration being higher than the second concentration.

2. The method of claim 1, wherein the first concentration ranges from 7E20 atoms/cm$^3$ to 5E21 atoms/cm$^3$, and the second concentration ranges from 2E20 atoms/cm$^3$ to 2E21 atoms/cm$^3$.

3. The method of claim 1, wherein the method of forming the strained material further comprises:

selectively growing a first layer with a first constant doping concentration, and the epitaxial layer being formed on the first layer; and selectively growing a second layer on the epitaxial layer with a second constant doping concentration.

4. The method of claim 3, wherein the first constant doping concentration for selectively growing the first layer ranges from 2E20 atoms/cm$^3$ to 6E20 atoms/cm$^3$, and the second constant doping concentration for selectively growing the second layer ranges from 2E20 atoms/cm$^3$ to 2E21 atoms/cm$^3$.

5. The method of claim 3, wherein the first layer is selectively grown with a first growing time, the epitaxial layer is selectively grown with a second growing time, the second layer is selectively grown with a third growing time, and the second growing time is longer than the first growing time and longer than the third growing time.

6. The method of claim 1, wherein the strained material comprises SiGe doped with a p-type dopant, or the strained material comprises SiC doped with an n-type dopant.

7. A method of fabricating a FinFET, comprising:

patterning a semiconductor substrate to form a plurality of trenches in the semiconductor substrate and at least one semiconductor fin between the trenches;

forming a plurality of insulators in the trenches;

forming a gate stack over portions of the semiconductor fin and over portions of the insulators;

removing the semiconductor fin revealed by the gate stack to form a recessed portion of the semiconductor fin;

selectively growing a strained material doped with a conductive dopant, the strained material being grown from the recessed portion of the semiconductor fin to cover the portions of the semiconductor fin revealed by the gate stack, the strained material comprising an epitaxial layer, and the epitaxial layer of the strained material being selectively grown with a gradient doping concentration of the conductive dopant, the gradient doping concentration being from a first concentration to a second concentration as a time of selectively growing, the epitaxial layer passes, and the first concentration being higher than the second concentration.

8. The method of claim 7, wherein the method of selectively growing the strained material comprises:

selectively growing a first layer on a surface of the recessed portion of the semiconductor fin with a first constant doping concentration;

selectively growing the epitaxial layer on the first layer with the gradient doping concentration, the epitaxial layer filling the recessed portion of the semiconductor fin and extending beyond top surfaces of the insulators; and selectively growing a second layer on the epitaxial layer with a second constant doping concentration.

9. The method of claim 8, wherein the second layer caps a top surface of the epitaxial layer.

10. The method of claim 7, wherein the first concentration ranges from 7E20 atoms/cm$^3$ to 5E21 atoms/cm$^3$, and the second concentration ranges from 2E20 atoms/cm$^3$ to 2E21 atoms/cm$^3$.

11. The method of claim 8, wherein the first constant doping concentration for selectively growing the first layer ranges from 2E20 atoms/cm$^3$ to 6E20 atoms/cm$^3$, and the second constant doping concentration for selectively growing the second layer ranges from 2E20 Atoms/cm$^3$ to 2E21 atoms/cm$^3$.

12. The method of claim 8, wherein the first layer is selectively grown with a first growing time, the epitaxial layer is selectively grown with a second growing time, the second layer is selectively grown with a third growing time, and the second growing time is longer than the first growing time and longer than the third growing time.

13. The method of claim 7, wherein the strained material comprises SiGe doped with a p-type dopant, or the strained material comprises SiC doped with an n-type dopant.

14. A fin field effect transistor (FinFET), comprising:

a semiconductor substrate comprising at least one semiconductor fin thereon;

a plurality of insulators disposed on the semiconductor substrate, the semiconductor fin being sandwiched by the insulators;

a gate stack over portions of the semiconductor fin and over portions of the insulators; and a strained material doped with a conductive dopant, the strained material covering portions of the semiconductor fin revealed by the gate stack, the strained material comprising an epitaxial layer having a gradient dopant concentration of the conductive dopant, the epitaxial layer being grown with a gradient doping concentration of the conductive dopant, the gradient doping concentration being from a first concentration to a second concentration as a time of growing the epitaxial layer passes, and the first concentration being higher than the second concentration.

15. The FinFET of claim 14, wherein the strained material further comprises:

a first layer having a first constant dopant concentration, and the epitaxial layer is disposed on the first layer; and a second layer disposed on the epitaxial layer and having a second constant dopant concentration.

16. The FinFET of claim 14, wherein the semiconductor fin further comprises a recessed portion, and the strained material further comprises:

a first layer disposed on a surface of the recessed portion of the semiconductor fin and having a first constant dopant concentration, the epitaxial layer is disposed on the first layer and fills the recessed portion of the semiconductor fin and extends beyond top surfaces of the insulators; and a second layer disposed on the epitaxial layer and having a constant second dopant concentration.

17. The FinFET of claim 16, wherein the second layer caps a top surface of the epitaxial layer.

18. The FinFET of claim 14, wherein the strained material comprises SiGe doped with a p-type dopant, or the strained material comprises SiC doped with an n-type dopant.

\* \* \* \* \*